United States Patent [19]

Ahamed

[11] Patent Number: 4,488,302
[45] Date of Patent: Dec. 11, 1984

[54] BURST ERROR CORRECTION USING CYCLIC BLOCK CODES

[75] Inventor: Syed V. Ahamed, Gillette, N.J.

[73] Assignee: AT&T Bell Laboratories, Murray Hill, N.J.

[21] Appl. No.: 465,790

[22] Filed: Feb. 11, 1983

[51] Int. Cl.³ ............................................. G06F 11/10
[52] U.S. Cl. ........................................ 371/40; 371/2
[58] Field of Search ................................ 371/40, 39, 2

[56] References Cited

U.S. PATENT DOCUMENTS

| | | | |
|---|---|---|---|
| 3,582,881 | 6/1971 | Burton | 371/40 |
| 3,585,586 | 6/1971 | Harmon | 371/2 |
| 4,238,852 | 12/1980 | Iga et al. | 371/40 |
| 4,312,069 | 1/1982 | Ahamed | 371/37 |
| 4,398,292 | 8/1983 | Doi et al. | 371/39 |
| 4,400,810 | 8/1983 | Ive | 371/40 |
| 4,413,340 | 11/1983 | Odaka | 371/39 |
| 4,425,644 | 1/1984 | Scholz | 371/40 |

OTHER PUBLICATIONS

Franco, Coding for Error-Free Communications, Electro-Technology, Jan. 1968, pp. 53–62, excl. 54.

*Primary Examiner*—Charles E. Atkinson
*Attorney, Agent, or Firm*—John T. Peoples; Robert O. Nimtz

[57] ABSTRACT

Methodology, and associated circuitry, for encoding and decoding data words to provide burst error correction capability are disclosed.

Encoder (14): partitions the data words into a plurality of subrate streams; individually codes these streams utilizing a block coding technique; and then recollates the coded streams as well as the associated parity words in an interleaved order to produce the encoder output.

Decoder (20): partitions the received words into a corresponding plurality of subrate received streams; individually computes the syndrome as well as shifted and divided versions of the syndrome for each received stream; after each shift and divide, compares the partial remainder with the applicable code characteristic polynomial; and corrects the applicable bit in the corresponding received subrate stream whenever the comparison indicates an error has occurred.

11 Claims, 7 Drawing Figures

FIG. 5

BURST ERROR CORRECTION USING CYCLIC BLOCK CODES

FIELD OF THE INVENTION

This invention relates generally to encoders and decoders for cyclic block codes of the Bose-Chaudhuri-Hocquenghem (BCH) type and, more particularly, to serial encoders and decoders with burst error correcting capability.

BACKGROUND OF THE INVENTION

Prior to the advent of high-speed technology exemplified by magnetic bubble devices and semiconductor shift registers, BCH-type encoders and decoders utilized a distributed series of exclusive OR gates to effect binary division which, in turn, generated encoder parity check bits and the decoder syndrome.

In my paper, entitled "The Design and Embodiment of Magnetic Domain Encoders for Single-Error Correcting Decoders for Cyclic Block Codes," published in the February, 1972 issue of the *Bell System Technical Journal*, a single exclusive OR gate arrangement was described to effect binary division. However, the topology of the arrangement was specific to magnetic domain technology.

In my recent U.S. Pat. No. 4,312,069 issued Jan. 19, 1982, the gate arrangement is generalized by utilizing semiconductor shift registers to accomplish binary division. Shift-in to the registers of the encoder occurs at the input data word rate and shift-out occurs at the output code word rate. The obverse obtains in the decoder. With the generalized arrangement, it is feasible to provide a synchronized, single error correcting data transmission system utilizing serial binary division for generating parity bits at the encoder and iteratively shifted versions of the syndrome at the decoder. Error correcting information is obtained by serial comparison of the iteratively shifted versions of the syndrome with the characteristic word of the code. Moreover, to insure the encoder functions properly whenever the number of parity bits is small, certain output buffer registers are segmented. These segmented registers have lengths that satisfy the data synchronism requirement as well as the shift register requirement that each of the storage means be shifting in or shifting out during predefined intervals within an encoding cycle.

It is well-known that noise on many telecommunication facilities which carry high-speed data, such as multipair cable, causes errors that typically occur in bursts. Conventional burst error correction techniques are available to mitigate errors: however, these techniques are not only complex but introduce considerable delay in the decoding process.

While single error correcting procedures of the type described in the aforementioned paper and patent prove to be of little direct value to correct for error bursts, it is possible to generalize the encoder and decoder structures, as well as the accompanying methodology, to correct for bursts of errors which have a presumed maximum length. Thus, the simplicity and ease of implementing single error correcting codes is retained within the burst error environment.

SUMMARY OF THE INVENTION

The limitations and restrictions of utilizing single error codes and codecs within a burst error environment is obviated with the present invention of a synchronized, burst error correcting data transmission system comprising an encoder and decoder.

Broadly speaking, within the encoder, the incoming data is partitioned into contiguous blocks with each block comprising a plurality of data words. New data words are formed for each block by interleaving bits from the original data words. Parity bits are computed for the new words presuming a given single error correcting cyclic code. These parity bits are also interleaved and then appended to the associated block for transmission. Thus, with this technique, every bit within a subset of coded bits is encoded with the bit in the same position in the second, third and so forth neighboring subset. The length of a subset is chosen as the maximum number of bits that are likely to suffer errors under burst conditions.

Again, broady speaking, the decoder or receiver performs decoding by calculating a syndrome for each new word utilizing both the interleaved words and associated parity words. Any detected errors are corrected and the words are rearranged to restore the original data stream.

The organization and operation of this invention will be better understood from a consideration of the detailed description of the illustrative embodiments thereof, which follow, when taken in conjunction with the accompanying drawing.

DETAILED DESCRIPTION

Figure 1:
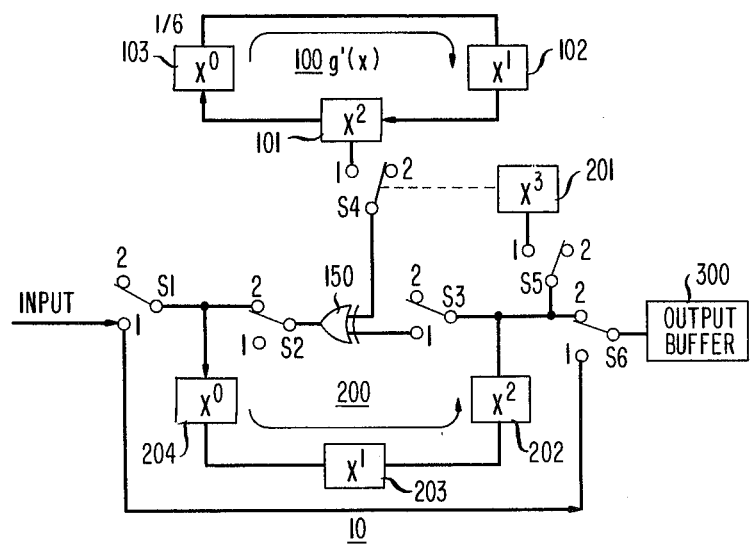
FIG. 1 is a circuit diagram of a prior art serial division processor exemplifying evaluation of the parity bits for a (7,4) Hamming code.

For clarity of exposition, it is helpful to provide a function theoretic basis to facilitate presentation of the illustrative embodiments. A (7,4) Hamming code, representing one particular code from the set of possible BCH codes, exemplifies function theoretic concepts. Also as an aid to illustrate the foundational concepts, the special encoder described by the applicant in the aforementioned paper is discussed. Descriptions of generalized illustrative embodiments of the present invention of an encoder, decoder and combination thereof follow the functional basis discussion.

1. Function Theoretic Basis

The primary purpose of this overview is to establish the terminology accompanying cyclic block codes and to define the mathematical manipulations associated with such codes. A more complete development of these concepts is presented in the text "Error-Correcting Codes" by W. W. Peterson and E. J. Weldon, MIT-Press, 1972.

Block codes constitute a set of codes in which a binary block of k-information bits has a binary block of $p=n-k$ parity bits appended to it, thereby constituting a (n,k) block code. The k-bit block is called the data word, the n-bit block the channel word and the p-bit block the parity check word. (It is worthwhile to note that the term "word" does not imply a fixed bit length. The length is variable depending on the context used; thus, for example, a data word has k bits whereas a channel word has n bits.)

It is convenient for manipulation purposes (as well as more esoteric mathematical purposes), to associate a polynomial with various code words. For instance, if a n-bit channel word has a bit stream given by 1010011, then the polynomial representation is $$c(X)=X^6+X^4+X^1+X^0=X^6+X^4+X+1,$$

corresponding to unity in the first, third, sixth and seventh binary positions.

For each cyclic code there exists a polynomial g(X) which divides every channel word. This polynomial is called the generator of the code; it is of length (p+1) bits. The polynomial g(X) is both irreducible and primitive in the field over which it is defined.

To understand how the division of code words by the generator polynomial proceeds, the c(X) above is divided by its generator $g(X)=X^3+X+1$ (1011):

```
                    X³ + 0 + 0  + 1
X³ + 0 + X + 1 / X⁶ + 0 + X⁴ + 0  + 0 + X + 1
                 X⁶ + 0 + X⁴ + X³
                 0 + 0  + X³ + 0
                 0 + 0  + 0  + 0
                    0 + X³ + 0 + X
                    0 + 0  + 0 + 0
                       X³ + 0 + X + 1
                       X³ + 0 + X + 1
                       0  + 0 + 0;
``` the remainder is three binary zeros, as postulated. In the division process, the "plus" symbol denotes the exclusive OR operation. With this convention defined, a short form polynomial division process may be accomplished using only bit manipulations; the above division has the form:

```
           1001
1011 / 1010011
       1011
       0010
       0000
        0101
        0000
         1011
         1011
         000.
```

In general, the first k bits of c(X) represent the data word, designated d(X), and the last $p=n-k$ bits of c(X) represent the parity check word, designated p(X). To obtain p(X) for each d(X), an augmented data word, designated e(X), is first formed from each d(X) by appending p zeros; p(X) is the remainder upon division of e(X) by g(X). For the c(X) given above, d(X) and e(X) are represented by the bit strings 1010 and 1010000, respectively; division of e(X) by g(X) yields 011 as a remainder, as anticipated.

Based on the discussion, the general function of an encoder is to receive information d(X) in contiguous blocks from a data source and generate the channel word c(X) in blocks. Two subfunctions are: (i) forming the augmented data word e(X) and dividing it by the generator function g(X); and (ii) appending the remainder, p(X), to d(X), thereby forming c(X).

As the channel word c(X) is transmitted through the system, errors may randomly occur and change the received bit pattern. For a single error correcting system, the decoder recovers the original information (bits) of d(X). The received channel word is designated r(X). To detect and correct an error, the decoder first divides r(X) by g(X). The remainder, of length p bits, is called the syndrome, designated s(X). This syndrome is compared to the characteristic polynomial of the code, designated $\Gamma(X)$, which is obtained as the remainder upon division of $X^{n-1}$ by g(X). If the syndrome matches $\Gamma(X)$, an error has occurred in the first bit position, that is, the one corresponding to $X^{n-1}$. If no match is achieved, the syndrome is shifted, that is, multiplied by X to yield Xs(X). This shifted version is divided by g(X) and the remainder is compared to $\Gamma(X)$. A match indicates an error in the position corresponding to $X^{n-2}$. No match causes another iteration of shift and divide. The shift, divide and match iterations proceed until a match is found, or in the case of no error, until a new received word r(X) is ready for processing.

To exemplify this discussion regarding decoder functions, the channel word c(X) above is assumed to be in error in the third binary position; thus, $r(X)=X^6+X+1$ (1000011). The characteristic word $\Gamma(X)$ for the generator word 1011 is found from:

```
            1011
1011 / 1000000
       1011
       0110
       0000
        1100
        1011
         1110
         1011
          101
``` or $\Gamma(X)=X^2+1$.

Division of r(X) by g(X) yields:

```
            1011
1011 / 1000011
       1011
       0110
       0000
        1101
        1011
         1101
         1011
          110
``` or $s(X)=X^2+X$.

Since s(X) does not match $\Gamma(X)$, the syndrome must be shifted and divided. A shorthand notation for this operation, as well as iterated versions thereof, is as follows:

$$g(X) = 1011 \overline{\smash{\big)}\, \begin{array}{c} 111\ldots \\ 1100 \end{array}} = Xs(X)$$
$$\underline{1011}$$
$$\overline{1110} = \begin{cases} \text{remainder is 111, no match} \\ X^2s(X) \text{ is 1110} \end{cases}$$
$$\underline{1011}$$
$$\overline{1010} = \begin{cases} \text{remainder is 101, } \underline{\text{match}} \\ X^2s(X) \text{ is 1010} \end{cases}$$

Since there is a match between the remainder of $X^2s(X)$ and $\Gamma(X)$, the third bit position is corrected (inverted) and the first k bits, representing $d(X)$, are extracted for postdetection processing by the decoder.

To demonstrate the division process in terms of a circuit arrangement, the topology of FIG. 1, representing an encoder for the (7,4) Hamming code, is considered. This topology represents a modified version of one set forth by the applicant in the above-mentioned paper.

The p least significant bits of g(X) (1011), denoted g'(X) (011), are stored in circulating shift register 100. Both before and after a circulation, register position 101 stores the highest order bit (0), register position 102 stores the next highest order bit (1) and register position 103 stores the remaining bit (1). Shift register 200 serves two purposes: (i) initially, register positions 201 through 204 receive and store the data word represented by d(X), with the highest order bit residing in position 201; and (ii) as the division process proceeds, register positions 201 through 204 store partial remainders, with the remainder after k(4) circulations representing the parity check word p(X). Switch S4 is designed to respond to the contents of register 201, closing only if the content of register 201 is a logic one. The contents of shift registers 100 and 200, once initialized with g'(X) and d(X), respectively, are circulated in synchronism and compared in exclusive OR circuit 150. Register 100 is circulated clockwise whereas register 200 circulates counterclockwise. The circulation time is chosen so that computation of the parity check bits and transmission of the results to output buffer 300 are completed before the arrival of the first bit from the next data word.

The operation of encoder 10, after emptying its contents from the last full cycle, is as follows:

| Step 1 | Switch | S1 | S2 | S3 | S4 | S5 | S6 |
|---|---|---|---|---|---|---|---|
| | Position | 1 | 1 | 2 | 1 or 2 | 2 | 1 |

The first 3 bits (101) are shifted into register 200 and output buffer 300.

| Step 2 | Switch | S1 | S2 | S3 | S4 | S5 | S6 |
|---|---|---|---|---|---|---|---|
| | Position | 1 | 1 | 2 | 1 or 2 | 1 | 1 |

Shift register 200 is shifted once more so that the highest order data bit enters position 201 and the 4th bit of data (0) enters position 204 and output buffer 300 simultaneously.

| Step 3 | Switch | S1 | S2 | S3 | S4 | S5 | S6 |
|---|---|---|---|---|---|---|---|
| | Position | 2 | 2 | 1 | 1 | 2 | 1 |

Shift registers 100 and 200 are completely circulated once.

| Step 4 | Switch | S1 | S2 | S3 | S4 | S5 | S6 |
|---|---|---|---|---|---|---|---|
| | Position | 2 | 1 | 2 | 1 | 2 | 1 |

Shift register 200 is shifted once so that the bit in position 202 shifts to position 201 and a "0" bit enters position 204. Steps 3 and 4 are repeated three more times, each time using the contents of register position 201 to determine the setting of switch S4. The division is now complete.

| Step 5 | Switch | S1 | S2 | S3 | S4 | S5 | S6 |
|---|---|---|---|---|---|---|---|
| | Position | 2 | 1 | 1 | 1 or 2 | 2 | 2 |

The parity check bits are emptied into buffer 300. The process is repeated for the next data word by returning to step 1.

Figure 2:
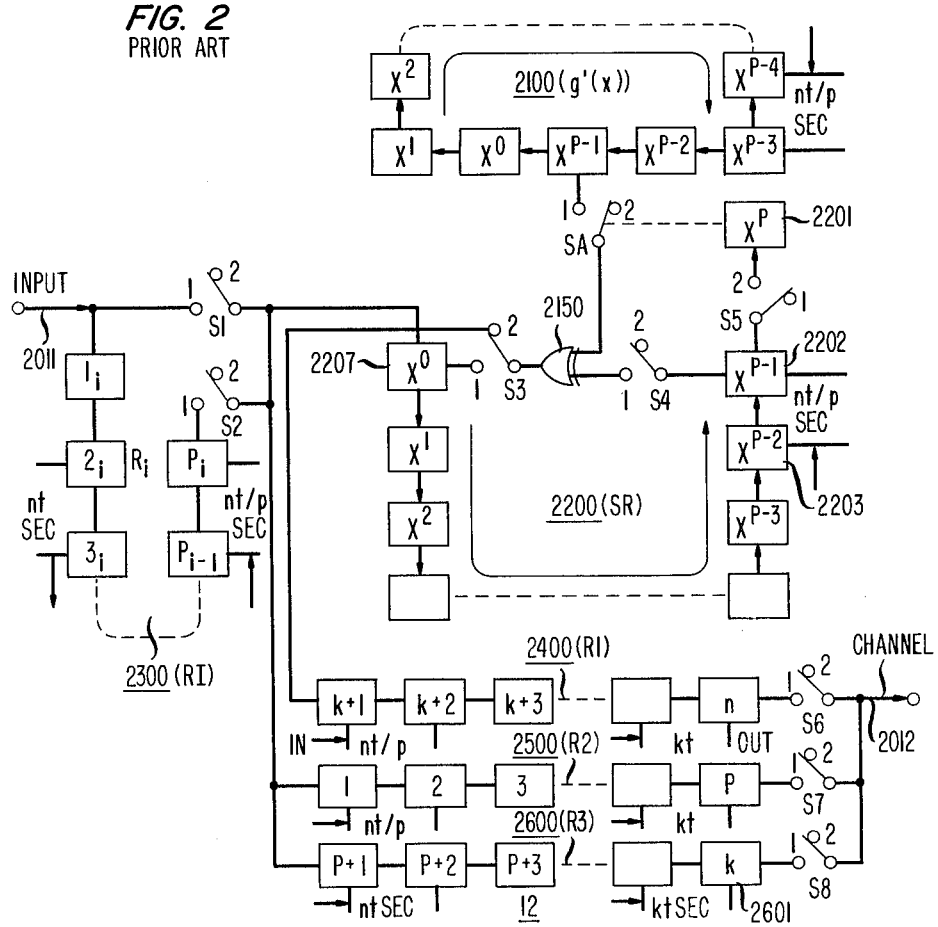
FIG. 2 is a circuit diagram of a prior art serial encoder for a general (n,k) block code having $p \geq 0.414 \, k$.

A prior art serial encoder 12 for a generalized (n,k) block code with $p \geq 0.414 \, k$ is depicted in FIG. 2; this encoder embodies division circuitry similar to that of FIG. 1. In the circuit arrangement of FIG. 2, incoming bits of data arrive uniformly on lead 2011 every nt seconds and coded information is transmitted every kt seconds on lead 2012. Code information is partitioned and stored in shift registers 2400, 2500 and 2600. These registers are emptied every kt seconds through corresponding switches S6, S7 and S8, respectively; only one of these switches is closed at any given instant of time. Shift register 2400(R1) is of length p and stores the parity check bits. Shift register 2500(R2) is also of length p and stores the first p bits of the present data word, designated d'(X) or d' (the ith bit is $d'_i$). Shift register 2600(R3) is of length (k-p) and stores the bits of d'(X) starting with the (p+1) bit and ending with the bit in position k. Shift register 2300(RI) is an interim store of length p and it collects the first p bits of each data word.

In operation, when register 2300 is full, its contents are moved, via switch S2 in position 1, to shift register 2200(SR) and shift register 2500 within the nt interval preceding the arrival of the (p+1) data bit. The shift is synchronized with movement of the parity check bits of the last data word to register 2400 via switch 3 in position 2. Thus, shift-in bits propagate between register positions every nt seconds in register 2300 and every nt/p seconds in registers 2200 and 2500, whereas shift-out bits propagate between register positions every nt/p seconds in register 2300.

The arrival of the (p+1) bit of d'(X) is synchronized with the movement of the first bit of d'(X) from register position 2202 to position 2201 via switch S5 in position 2, of the second bit from position 2203 to position 2202, and so forth, until the (p+1) bit is entered into register position 2207 via switch S1 in position 1. The circulation of register 2200 for division by the contents of register 2100 (g'(X)) occurs for the next k number of nt intervals; the circulate propagation interval between register positions in both register 2100 and 2200 is nt/p seconds. The operation of switches SA, S4 and S5 is essentially identical to the operation of switches S4, S3 and S5 in FIG. 1.

The binary division process is synchronized with the arrival of bits (p+1) through k of data word d'(X). These (k-p bits are stored in register 2600 via switch S1 and, as each bit arrives every nt seconds, it is entered into register position 2207. Moreover, during the division process, the data stored in register 2500, after a delay of (2n−k)kt seconds, is emptied, followed by a shifting-out of the contents of register 2600. The p parity bits residing in register 2200 are shifted to register 2400 during the nt interval proceding the last shift-out operation of register 2600. Also, shift register 2300 is accumulating the p bits of the next data word $d''(X)$ during this same nt interval.

The above cycle can be repeated indefinitely provided registers 2400, 2500 and 2600 can be emptied at the appropriate times.

Figure 3:
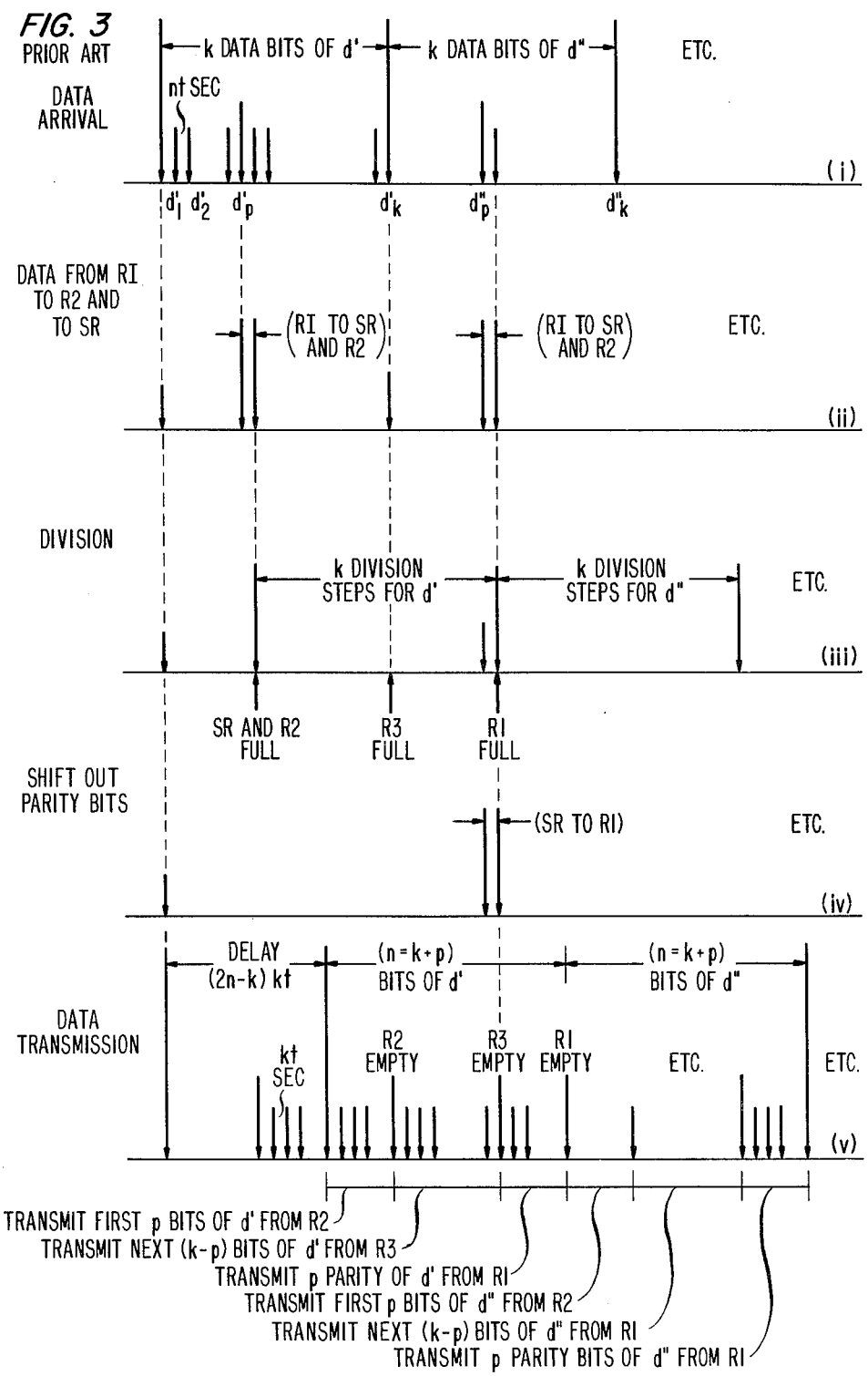
FIG. 3 is a timing diagram indicating the various processing intervals for the encoder shown in FIG. 2.

The operation of encoder 12 of FIG. 2 is summarized in the timing diagram of FIG. 3. Line (i) depicts the arrival intervals of data word $d'(X)$ and $d''(X)$. Line (ii) indicates the interval that bits are shifted from register 2300 to registers 2200 ans 2500. Line (iii) shows the interval for which the binary division process is activated. Line (iv) indicates when the parity bits are shifted. Finally, line (v) indicates the shifting-out order of segmented code information from shift registers 2400, 2500 and 2600.

2. General Principles of the Present Invention

Figure 4:
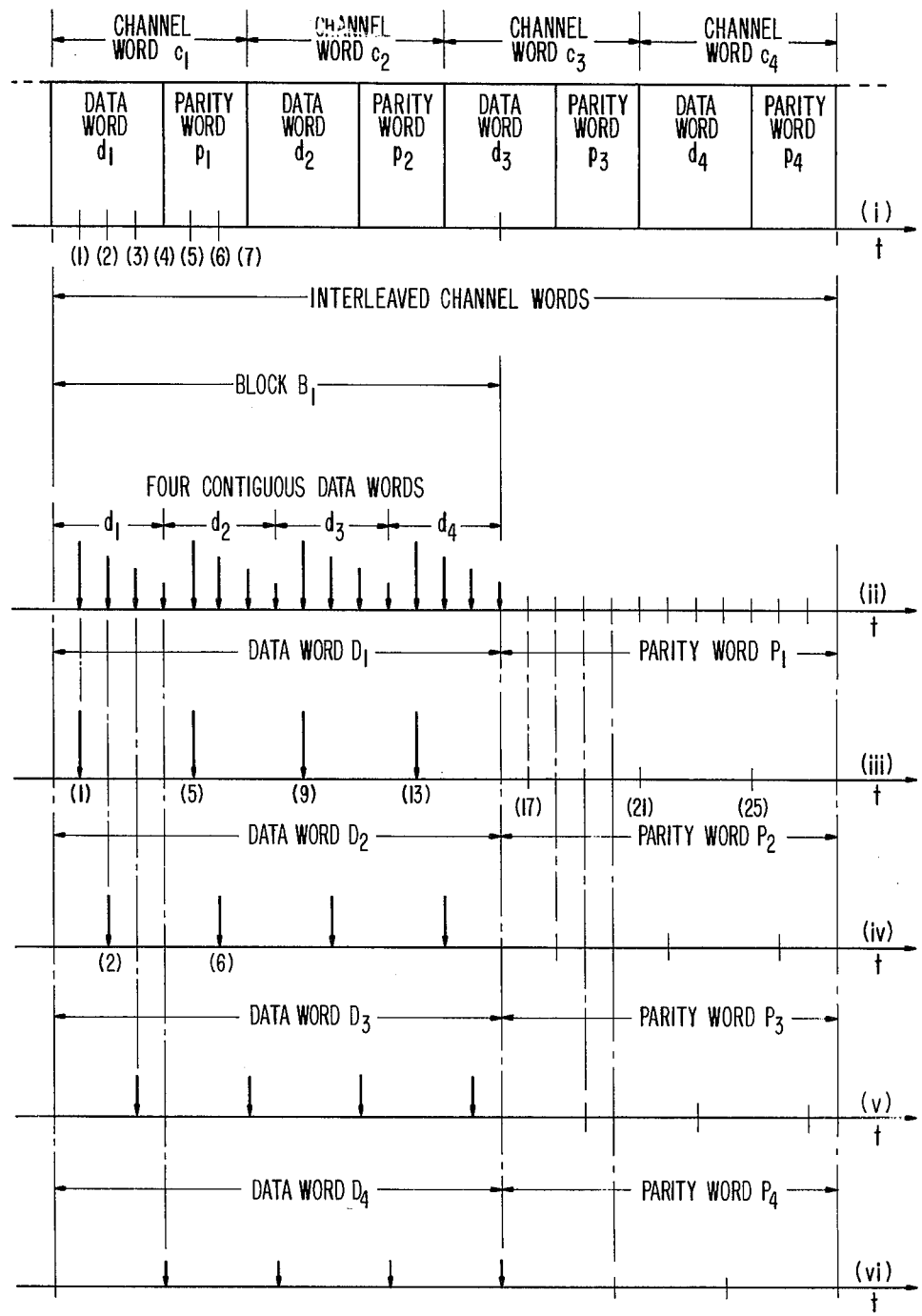
FIG. 4 illustrates an arrangement, in accordance with the present invention, of interleaved data words to effect burst error correction capability.

With reference to FIG. 4, line (i) depicts four contiguous data words $d_1$, $d_2$, $d_3$ and $d_4$, as well as the parity words $P_1$, $P_2$, $P_3$ and $P_4$ formed from each data word and appended to the associated data word, thereby forming contiguous channel words $c_1$, $c_2$, $c_3$ and $c_4$. The code used for illustration purposes is a (7,4) single error correcting code so, for example, the four data bits of $d_1$ occupy time intervals (1) through (4) and the parity bits fill time periods (5) through (7). It is understood that the illustration of line (i) may be generalized to depict an arbitrary (n,k) single error correcting code.

The coding arrangement depicted by line (i) only corrects for a single error within the time duration of each channel word. Thus, a burst of noise corrupting, for example, bits (1) and (2) of $d_1$, could not be compensated at the decoder. However, with an interleaved arrangement of data words depicted by lines (ii) through (vi) of FIG. 4, such a burst could be corrected. In fact, bursts of noise corrupting four contiguous bits out of every sixteen bits may be corrected with the illustrative arrangement.

Referring to line (ii) of FIG. 4, the four original data words $d_1$ through $d_4$ are juxtaposed to form block B, having sixteen consecutive samples or bits occupying time intervals (1) through (16). From these sixteen samples, four new data words $D_1$, $D_2$, $D_3$ and $D_4$ are formed. Data word $D_1$ is composed of information within time periods (1), (5), (9) and (13), as shown on line (iii). Similarly, data word $D_2$ includes data in periods (2),(6), . . . , as depicted on line (iv). Lines (v) and (vi) show the grouping of bits for $D_3$ and $D_4$, respectively.

For each new data word, a corresponding parity word is computed. For instance, with reference to line (ii), the parity word associated with $D_1$ is designated $P_1$; this word is comprised of bits occupying time periods (17), (21) and (25). The other parity words $P_2$, $P_3$ and $P_4$ are shown in lines (iv) through (vi), respectively. Perusal of lines (ii) through (vi) indicates that parity words are also interleaved when transmitted on the channel.

As alluded to above, it is now clear that a noise burst obliterating bits in intervals (1) and (2) may be corrected since the burst changes only one bit in $D_1$ and one bit in $D_2$, each of which may be restored with the single error correction capability embedded within the $D_1,P_1$ and the $D_2,P_2$ combinations.

3. Encoder Illustrative Embodiment

Figure 5:
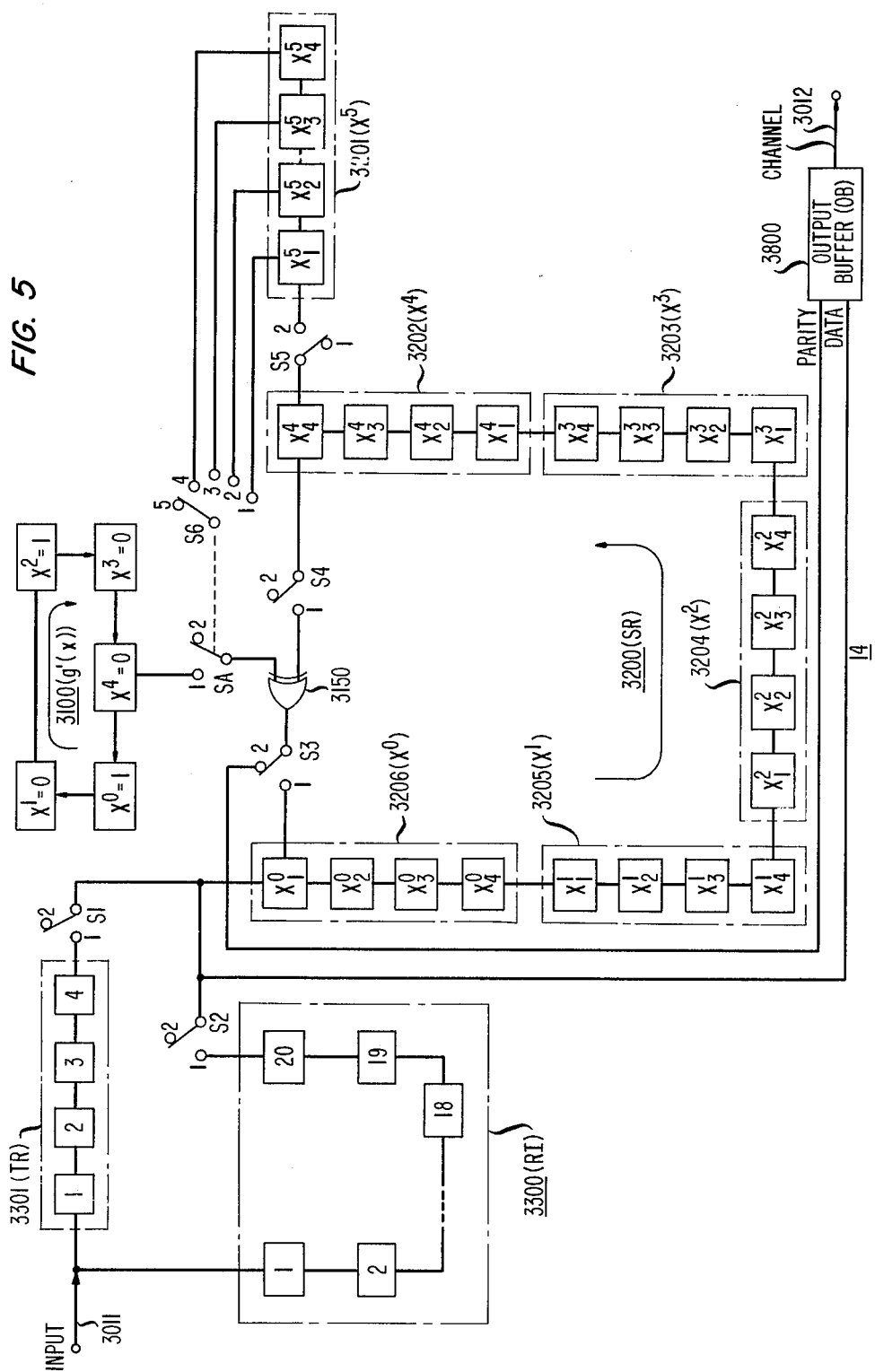
FIG. 5 is a circuit diagram depicting an illustrative embodiment of a serial encoder in accordance with the present invention.

An illustrative embodiment of a cyclic block encoder in accordance with the present invention is depicted in FIG. 5; this embodiment is a special case of the most general realization which may be straightforwardly deduced from the discussion that follows. Broadly speaking, encoder 14: partitions the main data stream, arriving on input lead 3011, into four subrate streams; individually codes these subrate streams utilizing serial binary division via shift register 3100 and 3200; and recollates the coded streams in the interleaved order to produce the output on channel lead 3012.

FIG. 5 depicts an encoder for a (30,25) code with a generator polynomial $g(X)$ of $X^5+X^2+1$ or $g'(X)=X^2+1$. Moreover, four contiguous words are grouped to form each block. The description proceeds utilizing the concepts developed above when FIGS. 1 through 3 were discussed.

In encoder 14, division takes place by circulating the contents of shift register 3200(SR) once for every step of the division, as set forth earlier. However, switch operation and timing are complicated by the fact that neighboring data bits occupy adjoining locations in the five, 4-bit subsets of register 3200. For instance, register $3206(X^0)$, during one stage of its operation, stores bits $X_1^0$, $X_2^0$, $X_3^0$ and $X_4^0$, the four latest bits shifted into register 3200. To accommodate the shifting in groups of four, 4-bit shift register 3301(TR) is employed. Data is shifted into register 3301 at the incoming rate of nt seconds and shifted out at the circulation rate, specified below, into locations $X_1^0$, $X_2^0$, $X_3^0$ and $X_4^0$ of register 3200 via switch S1. While data accumulates in register 3301, the contents of register 3200 are circulated to divide. Twenty-five such steps accomplish the division and the parity check bits are transmitted to output buffer 3800(OB) via switch S3 in position 2.

The shift rate of registers 3100 and 3200 must be sufficient (a) to circulate all bits once within registers 3100 and 3200 and (b) to shift leading bits from register $3202(X^4)$ into register $3201(X^5)$ as well as trailing bits into register 3206 from register 3301, with both (a) and (b) occurring within four nt time periods. This requirement is discussed in more detail below when FIG. 6 is presented.

Switch S6 is activated sequentially during the division process. For instance, switch S6 is in position 4 only for the one shift of bit positions within register 3200 and this occurs whenever bit $X_4^4$ of register $3202(X^4)$ holds the leading bit of the partial remainder corresponding to the first bit in the 4-bit subset. Similarly, position 3 of switch S6 is selected during the duration that original bit $X_3^4$ occupies location $X_4^4$, and so forth. Position 5 of switch S6 inhibits data from recirculating while incoming bits are moved from register 3301 to register 3206. Position 5 of switch S6 corresponds to position 2 of switch S5.

Figure 6:
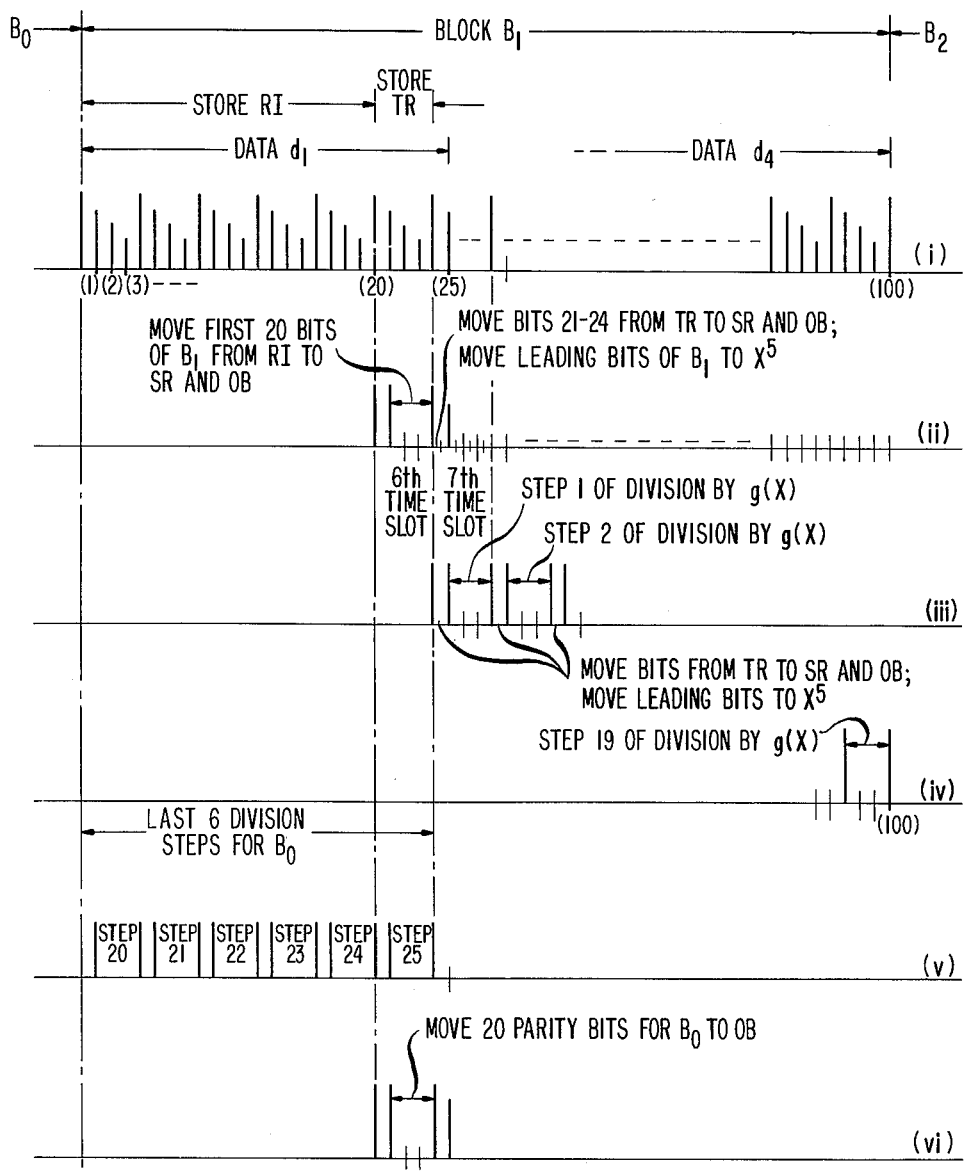
FIG. 6 is a timing diagram indicating the various processing intervals for the encoder of FIG. 5.

The discussion regarding data circulation within encoder 14 is summarized by the timing diagram shown in FIG. 6. On line (i), three data blocks $B_0$, $B_1$ and $B_2$ are depicted, although the focus is on block $B_1$. Data words $d_1$ through $d_4$, each of length 25 bits, are grouped to form block $B_1$. During the first twenty time intervals, or the first five 4-bit time slots, data is stored in register 3300(RI), whereas data is stored in register 3301 during time intervals (21) through (24). As depicted by lines (ii) and (iii) of FIG. 6, data bits 1 through 20 are moved from register 3300 to registers 3200 and 3800 during the last three-quarters of the sixth time slot. During the first one-eight of the seventh time slot, bits 21 through 24 of $B_1$ are shifted from register 3301 to registers 3206 and 3800 as the four leading bits (1 through 4) enter register 3201.

The division for block $B_1$ starts during the seventh, 4-bit time slot as shown on line (iii). For the last three-quarters of the seventh time slot, twenty shifts of register 3200 and five shifts of register 3300 perform the first step of the division. Moreover, the data bits 25 through 28 arriving on channel 3011 (FIG. 5) are accumulated in register 3301 and transferred to register 3800. The process repeats eighteen more times while the remaining bits (29th through 100th) arrive at register 3206 via register 3301. Line (iv) depicts this timing.

For the last six steps of the division, register 3200 circulates in a similar fashion, but switches S1 and S2 are in position 2 so that zeros enter register 3206. The parity bits of block $B_1$ are channeled to register 3800 as the first twenty bits of block $B_2$ enter register 3300. Similarly, and as depicted by lines (v) and (vi) of FIG. 6, the last six division steps of block $B_0$, which precedes block $B_1$, occur while data bits 1 through 24 are being processed and the parity bits of block $B_0$ are moved to register 3800 during the sixth time slot.

Although the discussion with respect to FIG. 6 utilized time subintervals measured in terms of one-eighth of each time slot, it is possible to recouch the discussion with a maximum subinterval resolution of one-sixth of each time period. Generally, then, the circulation and switch-controlling clock must be increased by at least a factor of six over the input data rate of nt to effect proper reception, division and transmission.

Moreover, although shift register 3100 was presumed to contain a single code generator polynomial during the foregoing discussion, it is also possible to partition each register position of register 3100 (e.g., $X^4$) into a plurality of locations so that a plurality of code polynomials may be circulated in synchronism with the data words contained in register 3200.

It is to be further understood that the encoder, and associated methodology, described herein is not limited to specific forms disclosed by way of example and illustration, but may assume other embodiments limited only by the scope of the appended claims.

4. Decoder Illustrative Embodiment

Figure 7:
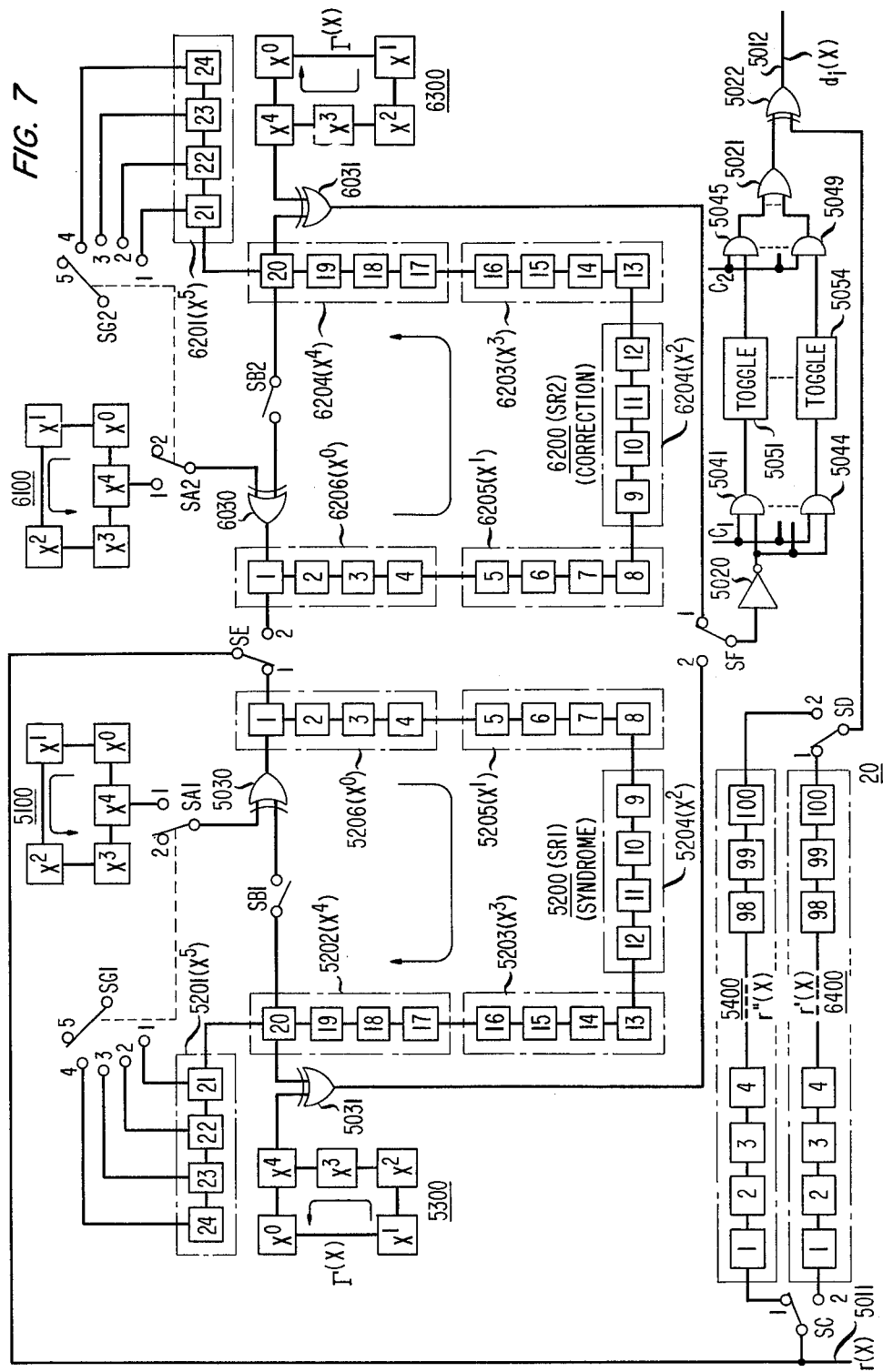
FIG. 7 is a circuit diagram depicting an illustrative embodiment of a serial decoder in accordance with the present invention.

The circuit diagram of FIG. 7 is an illustrative embodiment of a decoder implemented in accordance with the present invention. In general, decoding comprises three distinct steps: (i) the calculation of the syndrome s(X) of received word r(X); (ii) shift and divide procedure of the syndrome s(X), that is, multiplication of s(X) by $X^m$, m=0,1, ..., k−1, followed by the division $X^m s(X)/g(X)$; and (iii) after each shift and divide, comparison of the partial remainder with the characteristic polynomial $\Gamma(X) = X^{n-1}/g(X)$.

Decoder 20 of FIG. 7 has two syndrome shift registers 5200(SR1) and 6200(SR2), both of length 20. This embodiment is a specific realization of the (30,25) code example of the previous section; the general realization may be deduced from the discussion that follows. While register 5200 is processing one received word, designated r''(X) or 4'' (bits are designated $r_i''$, i=1,2, ..., 100) to determine its corresponding syndrome, register 6200 is shifting and dividing the syndrome of the previous received word r'(X).

Shift register 5100, containing g'(X), and register 5200, together with exclusive OR circuit 5030 and switches SA1, SB1 and SG1 comprise one basic serial divide circuit. The division process is substantially the same as the process of division for encoder 14 of FIG. 5.

The interleaving of channel words within each received word arriving at register 5200 precludes direct comparison between the remainder (obtained by dividing, shifting and then storing in register 5200), and the characteristic polynomial stored in register 5300 to produce error-correction information. To accommodate interleaving, register 5300 is circulated at the same rate as register 5100. Shift register 5300, of length p, stores the characteristic polynomial $\Gamma(X)$. When the decoder section associated with register 5300 operates in the shift and divide mode, the contents of register 5300 are compared bit-by-bit with the contents of register 5200 via exclusive OR circuit 5031. However, because of the different circulation rates between registers 5200 and 5300, each bit of register 5300 is compared to four consecutive bits of register 5200 particularly the high bit of register 5202 ($X^4$).

Shift register 5400 (r''(X)) stores the first 100 bits of r''(X) arriving on lead 5011 during the same interval that the syndrome of r''(X) is being computed. Operating in synchronism with the comparison circulation within register 5300 is the shifting-out operation of register 5400. To further accommodate interleaving, clock $C_1$ driving AND gates 5041,5044 and clock $C_2$ driving AND gates 5045,5049, operate in conjunction with registers 5300 and 5400 to select the proper bits for comparison. Also, toggles 5051,5054, under control of gates 5041–5049, are exposed only to respective bits interleaved which undergo comparison at exclusive OR gate 5031 (or 6031). Each toggle 5051 or 5054 operates only if an entire sequence of ones is received from inverter 5020 for five consecutive zeros corresponding to the number of bits in register 5300. Since all five inverted bits are one, an error has occurred. If the error is detected after the mth shift and divide operation, the mth bit in the corresponding subrate stream of r''(X) is complemented for error correction in exclusive OR gate 5022.

A structural and operational description similar to the one presented for the section corresponding to shift register 5200 applies for the decoder section associated with register 6200. All indicia of the latter section having corresponding elements are increased by 1000 over the indicia of the former section.

Data synchronization is achieved by switches SC, SD, SE and SF. These switches alternate between positions 1 and 2 for consecutive received words. The corrected, interleaved stream of data words appear on lead 5012, which is the output of gate 5022. A recollating circuit (not shown) following decoder 20 sifts the received data words to produce the original data words.

It is to be further understood that the decoder, and associated methodology, described herein is not limited to specific forms disclosed by way of example and illustration, but may assume other embodiments limited only by the scope of appended claims.

What is claimed is:

1. A method for encoding a series of data bits comprising the steps of forming contiguous blocks of interleaved data words, each of said words comprising unique ones of said bits separated by a predetermined number of said bits, each of said blocks comprising a preselected number of said data words, and producing encoded channel words corresponding to said blocks by generating and appending to each of said blocks parity words corresponding to said interleaved data words in the associated one of said blocks.

2. A method for encoding a stream of incoming data words comprising the steps of grouping a plurality of contiguous ones of said data words to form an incoming stream of data blocks, forming interleaved data words for each of said blocks, each of said interleaved words comprising single bits from corresponding positions in each of said incoming words, generating parity words corresponding to said interleaved words, forming interleaved versions of said parity words, and appending interleaved versions of said parity words to the associated ones of said blocks.

3. An encoder (14) for generating contiguous n-bit channel words from corresponding sets of incoming k-bit data words, said encoder comprising serial shift and divide means for generating p=n−k parity bits associated with groupings of bits from said data words, and wherein said encoder is further characterized by means for supplying interleaved versions of said data words, and shift register means (3200), partitioned into a serial arrangement of register segments (3201, . . . ,3206) of predetermined length corresponding to the number of data words in said set, for interleaving said parity bits one at a time with interleaved versions of said data words to produce each corresponding one of said channel words.

4. Circuitry (14) for encoding data bits to produce cyclically encoded channel words, said circuitry comprising serial shift and divide means (3100,3150,3200,S3,S4,S5,S6,SA) for dividing said bits by the code generator polynomial, said circuitry further characterized by means (3201, . . . ,3206), within said serial shift and divide means, for partitioning said data bits within said serial means to produce a series of subrate data streams, means (3300,3301,S1,S2), within said serial shift and divide means, for generating parity bits in said serial means corresponding to each of said subrate streams, and means (3800) for selecting and interleaving bits from a plurality of said subrate streams and said corresponding parity bits to provide contiguous ones of said channel words.

5. Circuitry (14) for encoding a stream of incoming data words characterized by means (3201, . . . 3206,3300,3301) for partitioning a plurality of contiguous ones of said data words ($d_1$, . . . ,$d_4$) from an incoming stream of data blocks ($B_0,B_1, B_2$), means (3200,S1,S2,S5,S6) for forming interleaved data words ($D_1$, . . . ,$D_4$) for each of said blocks ($B_1$), each of said interleaved words comprising single bits from corresponding positions in each of said incoming words, means (3100,3150,S3,S4,SA) for generating parity words corresponding to said interleaved words, means for forming interleaved versions of said parity words, and means (3800,S2,S3) for appending interleaved versions of said parity words to the associated ones of said blocks.

6. An encoder for generating parity check bits to append to incoming data bits to form a coded channel word of length mn, said channel word including m data words of length k formed by interleaving said data bits and m parity check words of length p=n−k formed by interleaving said parity bits, said encoder comprising first circulating shift register means (3100) for storing the p least significant bits of the code generator polynomial, second circulating shift register means (3200) for receiving and storing a plurality of bits from said data words and sequentially shifted and divided versions of said data words, the least of said divided versions representing said parity words, indicator shift register means (3201) for storing a plurality of outputs from said second shift register means, an exclusive OR circuit (3150), interim shift register means (3300) for receiving and storing the first m(p−1) of said incoming bits, output buffer means (3800) for receiving and storing said data words and said parity words transmitted by said second shift register, means for forming sequentially shifted and divided versions of said data words, first means (S2) for connecting the output of said interim shift register to the input of said second shift register and the input of said output buffer during predetermined time periods, second means (S3) for connecting the output of said exclusive OR circuit to the input of said output buffer during preselected time periods, third means (S5) for connecting the output of said second shift register to said indicator shift register during predetermined time intervals, fourth means (S4), operating alternately with said third means for connecting said output of said second shift register to one input of said exclusive OR circuit, wherein said encoder is further characterized by input buffer means (3301) for receiving and storing said incoming bits in m-bit segments, fifth means (S1) for connecting said input buffer to said second shift register during preselected time slots, said indicator shift register is of length m with each storage location having a separate output port, sixth means (S6) for sequentially connecting to each said output port and then to logic zero during predefined time periods, seventh means (S7), responsive to said sixth means, for connecting the other input of said exclusive OR circuit to the output of said first shift register or to logic zero whenever the output of said sixth means is a logic one or zero, respectively, said second shift register is partitioned into p register segments, each of length m, and means for circulating the contents of said first and second shift registers during said preselected time slots for bit-by-bit comparison in said exclusive OR circuit, said second shift register having a circulation rate at least m times the circulation rate of said first shift register.

7. A method for decoding a series of data bits comprising the steps of
forming a series of data words and associated parity words, each of said data words and parity words comprising unique ones of said bits separated by a predetermined number of said bits,
generating and iteratively shifting a plurality of syndromes, and
correcting any error in each of said data words in accordance with a predetermined pattern in any of the iteratively shifted syndromes corresponding to said each of said data words.

8. A method for decoding a received word composed of interleaved bits from a plurality of data words and corresponding parity words, said method comprising the steps of
(i) partitioning shift register means into a serial arrangement of register segments having lengths corresponding to the number of said data words,
(ii) serially shifting and dividing said received word by the code generator word to produce iteratively shifted syndromes corresponding to said data words,
(iii) storing said syndromes simultaneously in said register means, each of said segments containing one bit per each of said syndromes,
(iv) comparing each of said syndromes with the code characteristic polynomial to generate error detection information, and
(v) correcting any errors in said received word in accordance with the number of iterations of steps (ii) through step (iv) for each of said syndromes.

9. A decoder (20) for burst-error correcting a received word comprising serial shift and divide means for generating a set of syndromes, and iteratively shifted versions thereof, corresponding to grouping of bits from said received word, and wherein said decoder is further
characterized by
shift register means (5100,5200,5030,SA1,SB1,SG1), partitioned into a serial arrangement of register segments (5201, . . . , 5206) of predetermined length corresponding to the number of said groupings, for producing and selecting a series of interleaved words corresponding to said syndromes and said iteratively shifted versions,
means for determining the number of iterations,
correction means (5031,5020,5041, . . . ,5049,5050,5054, 5300,SF), responsive to said register means, for correcting said received word in response to a predetermined output from said register means and in accordance with the number of iterations performed in generating each of said iteratively shifted versions,
means for enabling said correction means, and
means for providing said number of iterations to said correction means.

10. A decoder for burst error correcting an incoming coded channel word of length mn, said channel word including m data words of length k formed by interleaving data bits and m parity check words of length $p=n-k$ formed by interleaving parity check bits generated from said data bits, said decoder comprising
first circulating shift register means (5100) for storing the p least significant bits of the code generator polynomial,
means for producing a plurality of syndromes,
means for producing shifted and divided versions of said syndromes,
second circulating shift register means (5200) for receiving and storing a plurality of bits from said data words and the syndromes corresponding to said data words as well as the shifted and divided versions of each of said syndromes,
indicator shift register means (5201) for storing a plurality of outputs from said second shift register,
a first exclusive OR circuit (5030) having its output connected to the input of said second shift register,
first means (SE) for connecting said input of said second shift register to said incoming coded word to receive bits one through mk and to logic zero for mp additional bits,
second means (SB1) for connecting the output of said second shift register to one input of said first exclusive OR circuit during predetermined time periods,
third circulating shift register means (5300) for storing the p bits representing the code characteristic polynomial,
a second exclusive OR circuit 5031) responsive to said output of said second shift register and the output of said third shift register,
wherein said decoder is further
characterized by
said indicator shift register being of length m with each storage location having a separate output port,
third means (SG1) for sequentially connecting to each said output port and then to logic zero during predefined time periods,
fourth means (SA1), responsive to said third means, for connecting the other input of said first exclusive OR circuit to the output of said first shift register or to logic zero whenever the output of said third means is a logic one or zero, respectively,
said second shift register is partitioned into p register segments, each of length m,
first means (5200) for circulating the contents of said first and second shift registers during preselected time slots for bit-by-bit comparison in said first exclusive OR circuit, said second shift register having a circulation rate at least m times the circulation rate of said first shift register,
second means (5300), operating simultaneously with said first means for circulating during circulation of said mp additional bits, for synchronously circulating the contents of said second shift register and said third shift register for bit-by-bit comparison in said second exclusive OR circuit, and
means (5400,5041-5049,5051-5054,5020,5021,5022,SD,SF) responsive to said channel word and the output of said second exclusive R circuit, for correcting said channel word at locations corresponding to the locations in said register segments and to the number of circulations of said second means for circulating whenever said second exclusive OR indicates an error condition.

11. In combination, a method for encoding a series of data bits into a channel word and for decoding said channel word comprising the steps of forming contiguous blocks of interleaved data words, each of said words including unique ones of said bits separated by a predetermined number of said bits, each of said blocks including a preselected number of said data words, producing encoded channel words corresponding to said blocks by generating and appending to each said of said blocks parity words corresponding to said interleaved data words in the associated one of said blocks, forming a series of received words and associated check words, each of said received words and check words including unique bit positions from said channel word separated by a predetermined number of said positions, enabling the correction of any error in each of said data words, and correcting any error in each of said data words in accordance with a predetermined pattern in any of the iteratively shifted syndromes corresponding to said each of said received words.

* * * * *